(12) United States Patent
Richter et al.

(10) Patent No.: US 8,426,312 B2
(45) Date of Patent: Apr. 23, 2013

(54) METHOD OF REDUCING CONTAMINATION BY PROVIDING AN ETCH STOP LAYER AT THE SUBSTRATE EDGE

(75) Inventors: Ralf Richter, Dresden (DE); Tobias Letz, Dresden (DE); Holger Schuehrer, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 1050 days.

(21) Appl. No.: 11/531,793

(22) Filed: Sep. 14, 2006

(65) Prior Publication Data
US 2007/0155133 A1    Jul. 5, 2007

(30) Foreign Application Priority Data
Dec. 30, 2005   (DE) .......................... 10 2005 063 089

(51) Int. Cl.
*H01L 21/461*        (2006.01)

(52) U.S. Cl.
USPC ........... 438/689; 438/694; 438/700; 438/705; 438/709

(58) Field of Classification Search ............... 438/689, 438/694, 700, 705, 759
See application file for complete search history.

(56) References Cited

U.S. PATENT DOCUMENTS

| | | | | |
|---|---|---|---|---|
| 5,426,073 A | * | 6/1995 | Imaoka et al. | 438/597 |
| 6,211,086 B1 | | 4/2001 | Lee et al. | 438/688 |
| 6,426,270 B1 | | 7/2002 | Sakaguchi et al. | 438/406 |
| 6,607,983 B1 | * | 8/2003 | Chun et al. | 438/691 |
| 2003/0045101 A1 | | 3/2003 | Flanner et al. | 438/689 |

FOREIGN PATENT DOCUMENTS

DE           103 26 273 A1     1/2005 ................ 21/768

* cited by examiner

*Primary Examiner* — Thanh V Pham
(74) *Attorney, Agent, or Firm* — Williams, Morgan & Amerson, P.C.

(57) ABSTRACT

By providing an etch stop layer selectively at the bevel, at least one additional wet chemical bevel etch process may be performed prior to or during the formation of a metallization layer without affecting the substrate material. Hence, the dielectric material, especially the low-k dielectric material, may be reliably removed from the bevel prior to the formation of any barrier and metal layers. The etch stop layer may be formed at an early manufacturing stage so that a bevel etch process may be performed at any desired stage of the formation of circuit elements.

10 Claims, 4 Drawing Sheets

METHOD OF REDUCING CONTAMINATION BY PROVIDING AN ETCH STOP LAYER AT THE SUBSTRATE EDGE

BACKGROUND OF THE INVENTION

1. Field of the Invention

Generally, the present invention relates to the fabrication of integrated circuits, and, more particularly, to the formation of metallization layers and contaminations related thereto in subsequent processes.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500-1000 and more individual process steps in sophisticated integrated circuits, are performed simultaneously for all chip areas on the substrate, except for photolithography processes, certain metrology processes and packaging of the individual devices after dicing the substrate. Thus, economical constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral chips are positioned as closely as possible to the substrate perimeter as is compatible with substrate handling processes. Generally, most of the manufacturing processes are performed in an automated manner, wherein the substrate handling is performed at the back side of the substrate and/or the substrate edge, which typically includes a bevel at least at the front side of the substrate.

Due to the ongoing demand for shrinking the feature sizes of highly sophisticated semiconductor devices, copper and alloys thereof, in combination with a low-k dielectric material, have become a frequently used alternative in the formation of so-called metallization layers, which include metal lines and vias connecting individual circuit elements to provide the required functionality of the integrated circuit. Although copper exhibits significant advantages when compared to aluminum as being the typical metallization metal for the last decade, semiconductor manufacturers have been somewhat reluctant to introduce copper in the production, owing to copper's ability to readily diffuse in silicon and silicon dioxide. Moreover, even when being present in very small amounts, copper may significantly modify the electrical characteristics of silicon and, thus, the behavior of circuit elements, such as transistors and the like. It is, therefore, essential to confine the copper to the metal lines and vias by using appropriate insulating and conductive barrier layers so as to strongly suppress the diffusion of copper into sensitive device regions. Furthermore, any contamination of process tools, such as transport means, transport containers, robot arms, wafer chucks and the like, must be effectively restricted, since even minute amounts of copper deposited on the back side of a substrate may lead to diffusion of the copper into sensitive device areas.

The problem of copper and other device and tool contamination is even exacerbated when low-k dielectric materials are employed in combination with copper to form metallization layers, owing to the reduced mechanical stability of the low-k dielectrics. Since at least some of the deposition processes used in fabricating semiconductors may not be efficiently restricted to the "active" substrate area, a stack of layers or material residues may also be formed at the substrate edge region, including the bevel, thereby generating a mechanically unstable layer stack owing to process non-uniformities at the substrate edge and especially at the bevel of the substrate. In particular, low-k dielectrics formed by chemical vapor deposition (CVD) tend to adhere more intensively at the bevel edge region compared to the active substrate region, thereby building up an increased layer thickness that may be up to twice the thickness of the dielectric material in the active region. Thus, during the formation of a plurality of metallization layers, a layer stack at the bevel region may be formed that includes barrier material, copper and dielectrics which exhibit a reduced adhesion to each other. During the further production and substrate handling processes, material such as copper, barrier material and/or the dielectrics may delaminate and significantly affect these processes, thereby negatively affecting production yield and tool integrity.

For instance, in forming a copper-based metallization layer, the so-called damascene technique is presently a preferred manufacturing method to create metal lines and vias. To this end, a dielectric layer, typically comprised of a low-K dielectric, is deposited and patterned to include trenches and vias in accordance with design requirements. Thereafter, a conductive barrier layer comprised of, for example, tantalum, tantalum nitride, titanium, titanium nitride and the like, is deposited, wherein the composition of the barrier layer is selected so as to also improve the adhesion of the copper to the neighboring dielectric. The deposition of the barrier layer may be accomplished by chemical vapor deposition (CVD) or physical vapor deposition (PVD), wherein a deposition of the barrier material may not be efficiently restricted to the active substrate area by presently established deposition techniques. Consequently, the barrier material may also be deposited at the substrate bevel and partially at the back side of the substrate, thereby forming, in combination with residues of the dielectric material that may not be efficiently removed by the previous etch processes for patterning the dielectric layer, a layer stack of reduced mechanical stability. Thereafter, according to a standard damascene process flow, a thin copper seed layer is deposited by physical vapor deposition or similar appropriate processes to initiate and promote a subsequent electrochemical deposition process to fill the trenches and vias formed in the dielectric material.

Although reactor vessels for the electrochemical deposition, such as electroplating reactors or electroless plating reactors, may be designed such that substantially no copper is deposited at the substrate edge, the preceding seed layer deposition process may nevertheless result in a significant deposition of unwanted copper at the substrate edge region. After the electrochemical deposition of the bulk copper, any excess material has to be removed. This is frequently achieved by chemical mechanical polishing (CMP), wherein material fragments, such as copper pieces, may "flake off," owing to the reduced stability of the metallization layer stack, especially at the substrate bevel. The copper-containing material flakes and other material flakes comprised of dielectric material and/or barrier material, for instance liberated during the CMP process, may then re-deposit at unwanted substrate regions or may affect the CMP process of subsequent substrates. During the further processing of the substrate, a contamination, mainly caused by the delamination at the substrate edge, may occur and may especially adversely affect the so-called back-end process flow, in which contact pads and solder bumps are formed.

Since contamination caused by, for instance, unwanted copper at the substrate edge has been identified as a major contamination source, great efforts are being made to remove copper from the substrate edge and the bevel substantially without affecting the inner, i.e., the active, substrate region. To this end, etch modules have been developed by semiconductor equipment providers, such as Semitool Inc., Novellus Inc. and the like, which are configured to selectively provide an agent substantially comprised of sulfuric acid and hydrogen peroxide to the substrate edge to remove unwanted copper from this region. Although the removal of unwanted copper from the substrate edge reduces the risk of copper contamination of subsequent processes, it turns out, however, that a significant reduction of production yield, especially in the manufacturing sequence for higher metallization layers and in the back-end process flow, is still observable.

In view of the situation described above, a need exists, therefore, to provide an improved technique for avoiding, or at least reducing the effects of, one or more problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of metallization layers of semiconductor devices, and in illustrative embodiments of semiconductor devices including copper-based metal lines embedded in a low-k dielectric material, with a reduced probability for substrate and/or tool contamination. For this purpose, an additional etch stop layer is selectively formed at the bevel region of the substrate prior to forming a metallization structure so as to enable the reduction of the delamination of dielectric material and/or metallic material during the formation of a metallization layer in that at least the dielectric material is substantially completely removed from the bevel region of the substrate. Moreover, any further unwanted materials created during the further processing of the substrate may also be efficiently removed by a spatially selective bevel etch process substantially without exposing the substrate material. Hence, any barrier material or metal may be effectively removed. In this way, the formation of a mechanically unstable dielectric layer stack in the bevel region of the substrate may be substantially avoided. In some illustrative embodiments, the etch stop layer may be selectively formed at the bevel in an early manufacturing state, thereby enabling the removal of any unwanted materials substantially throughout the entire manufacturing process in a highly compatible manner.

According to one illustrative embodiment of the present invention, a method comprises selectively forming a first etch stop layer above a bevel region of a substrate, wherein the substrate has a central region adjacent to the bevel region for receiving circuit elements therein. The method further comprises forming a dielectric layer stack for a metallization layer above the substrate. Moreover, a portion of at least one layer of the dielectric layer stack is removed from the bevel region by selectively applying an etchant to the bevel region while using the first etch stop layer to reduce etch damage of the substrate. Finally, the dielectric layer stack is patterned in the central region to receive at least one of a via and a trench.

According to another illustrative embodiment of the present invention, a method comprises forming an etch stop layer above a bevel region and a central region of a substrate, wherein the central region is configured to form therein a transistor element. The method further comprises selectively removing the etch stop layer from the central region while maintaining the etch stop layer in the bevel region and selectively removing material from the bevel region using the etch stop layer as a protecting layer.

BRIEF DESCRIPTION OF THE DRAWINGS

The invention may be understood by reference to the following description taken in conjunction with the accompanying drawings, in which like reference numerals identify like elements, and in which.

Figure 1A:
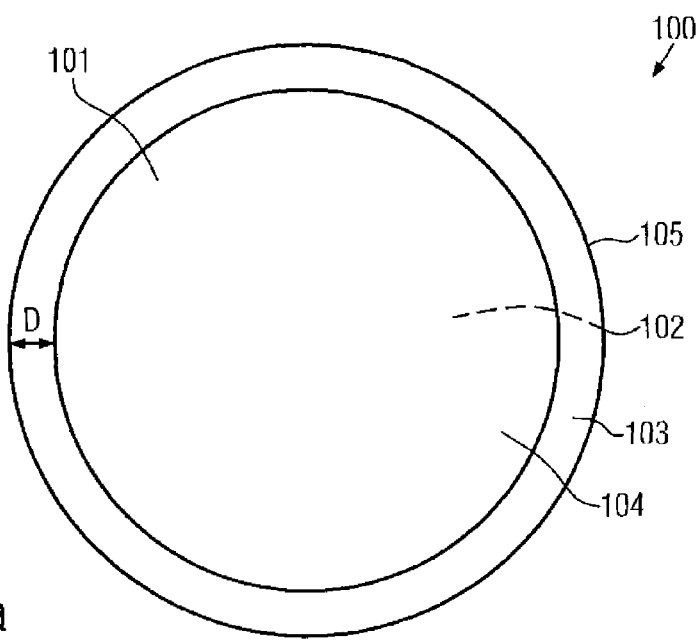
FIG. 1a schematically depicts a top view of a substrate including an "active" region or a device region that is located adjacent to an edge region that includes a bevel.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique that enables the formation of circuit elements within a device region of a substrate with a significantly reduced probability of device and tool contamination, in particular when the devices comprise a complex metallization structure including one or more metallization layers on the basis of a low-k dielectric. It is believed that the formation of mechanically unstable dielectric layer stacks on the bevel of the substrate may significantly contribute to the overall contamination and defect rate in this manufacturing phase and in subsequent processes. By providing an appropriate etch stop layer selectively in the bevel region, the selective removal of dielectric and metal residues from the substrate bevel which may not be completely removed by the anisotropic etch processes used for patterning the metallization layer stack may significantly reduce the risk for "flaking" off of dielectric and metallic material during the further processing of the substrate. It should be appreciated that the present invention is particularly advantageous in the context of metallization layers including copper and copper alloys in combination with low-k dielectric materials, since, as previously explained, during the deposition of the low-k dielectric materials, which may per se exhibit a reduced mechanical stability and adhesion compared to conventional dielectric materials, such as silicon dioxide, silicon nitride and the like, an increased layer thickness may be created on the bevel region, thereby enhancing even more the risk of material delamination during subsequent substrate handling and manufacturing processes. The present invention may, however, also be applied in combination with other manufacturing and metallization schemes as the selectively formed etch stop layer may be provided at any appropriate manufacturing state, thereby improving production yield, due to a significant reduction of particles created by substrate handling processes, chemical mechanical polishing processes and the like. Thus, unless otherwise explicitly specified in the description and the appended claims, the present invention should not be restricted to a specific material composition of the dielectric materials and the conductive materials used for the formation of metallization layers.

With reference to FIGS. 1a-1h, further illustrative embodiments of the present invention will now be described in more detail. FIG. 1a schematically depicts a substrate 100 having a front side 101 on which circuit elements, such as transistors, may be formed, and having a back side 102, which is frequently in contact with any type of substrate holders during the transport and processing of the substrate 100. The front side 101 of the substrate 100 may be divided into an "active" or central region 104, within which the plurality of individual chips are to be arranged, and into an edge region 103, which may not be used for the fabrication of circuit elements due to process non-uniformities, substrate handling requirements and the like, wherein particularly deposition non-uniformities may occur at the vicinity of the substrate perimeter that typically includes a bevel 105, as will be described in more detail with reference to FIG. 1b. The size of the edge region 103 and thus of the central region 104 depends on the controllability of the processes involved in manufacturing circuit elements in and on the central region 104, the capability of transport means used for supporting and transporting the substrate 100 between subsequent processes and the like. Desirably, the size of the edge region 103 may be kept as small as possible to arrange as many chip areas as possible on the central region 104. Presently, 200 mm and 300 mm are typical diameters of substrates used in modern semiconductor facilities, wherein a width D of the edge region 103 may range from approximately 1-5 mm.

Figure 1B:
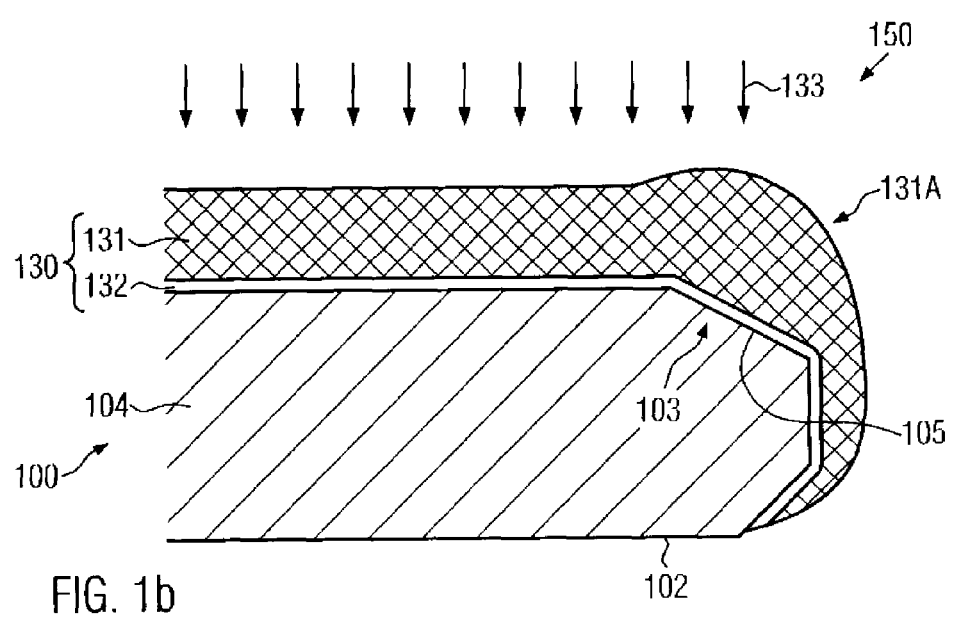
FIGS. 1b-1h schematically show cross-sectional views of a part of the substrate in FIG. 1a, wherein various manufacturing stages during the formation of the metallization layer with removal of unwanted dielectric material from an edge region on the basis of an etch stop layer are illustrated in accordance with illustrative embodiments of the present invention.

FIG. 1b schematically shows a cross-sectional view of a semiconductor device 150 comprising a portion of the substrate 100, wherein the edge region 103 comprises the bevel 105. It should be appreciated that, in some illustrative embodiments, in this manufacturing stage, the substrate 100 may have formed therein and thereon a plurality of circuit elements that are located in the central region 104, wherein, for convenience, any such circuit elements are not shown. In still other embodiments, the device may be in an early manufacturing stage, in which circuit elements, such as a transistors, are not yet complete in the central region. In one embodiment, the device 150 may be in a state in which any material layers required for the formation of circuit elements in the central region 104 have not yet been formed or deposited.

Moreover, a layer stack 130 may be formed above the substrate 100, which is also formed in the edge region 103 and the bevel 105. The layer stack 130 may comprise an etch stop layer 132 and a mask layer 131. In one illustrative embodiment, the mask layer 131 may be comprised of a low-k dielectric material having the property to exhibit a highly nonuniform deposition behavior with respect to the central region 104 and the bevel 105 when applied by CVD techniques, as previously discussed. In this respect, a low-k dielectric material has to be understood as an insulating material having a relative permittivity of 3.0 or less. In one particular embodiment, the mask layer 131 comprises a material including silicon, carbon, oxygen and hydrogen, which is represented by the formula SiCOH. In one illustrative embodiment, the mask layer 131 may comprise a portion of increased thickness 131A at the bevel 105, while, in other embodiments, the portion 131A may have, in addition or alternatively to the increased thickness, a modified structure compared to the central region 104, wherein the modified structure in the portion 131A results in a reduced etch rate with respect to a specified etch recipe. Moreover, the etch stop layer 132 may be selected so as to exhibit a high etch selectivity with respect to a plurality of materials, such as a low-k material, barrier material, metal, such as copper, and the like, with respect to a wet chemical selective bevel etch process, as will be described in more detail later on. In one illustrative embodiment, the etch stop layer 132 may be comprised of silicon carbide which has a high etch resistivity against a plurality of wet chemical etchants. It should be appreciated that the layer stack 130 may comprise additional layers, as will be described later on.

The semiconductor device 150 as shown in FIG. 1b may be formed in accordance with the following processes. Prior to, after or in an intermediate state of the formation of any circuit elements within the central region 104 in accordance with well-established techniques, the layer stack 130 may be formed by depositing the etch stop layer 132. The deposition of the etch stop layer 132 may be performed on the basis of well-established plasma enhanced chemical vapor deposition (PECVD) techniques, wherein, usually, material in the edge region 103 and on the bevel 105 is also deposited. Furthermore, in many deposition techniques, such as chemical vapor deposition (CVD), sputter deposition and the like, the deposition of material may not be reliably restricted to a desired substrate portion without causing other negative effects, in particular for sophisticated semiconductor devices. In the present invention, this conventionally undesired behavior is advantageously used for forming the etch stop layer 132 so as to substantially completely cover the bevel 105. Thereafter, the mask layer 131 may be deposited by any appropriate deposition technique, wherein, in one illustrative embodiment, the mask layer 131 is formed by PECVD, wherein at least a portion of the mask layer 131 is comprised of a low-k dielectric material. It turns out that, in particular during the plasma-based deposition of low-k dielectric materials, an increased deposition rate is obtained at the bevel 105, thereby creating the portion 131A of increased layer thickness compared to the thickness of the layer 131 in the central region 104. As previously explained, this increased portion 131A, that may also form when a corresponding interlayer dielectric for a metallization layer is provided, may not be reliably removed during a subsequent conventional etch process. This deposition and etch behavior, which is highly disadvantageous during the formation of a metallization layer, may be used to form an etch mask for the subsequent selective removal of the etch stop layer 132 in the central region 104. Hence, after the deposition of the mask layer 131, an etch process 133 is performed to remove the mask layer 131 in the central region 104, while maintaining a significant part of the portion 131A above the bevel 105. The etch process 133 may be any appropriate process, such as a wet chemical process or a dry process, having a high selectivity between the etch stop layer 132 and the mask layer 131. Appropriate selective recipes for a plurality of material combinations are well established in the art. For example, selective etch recipes for SiCOH and silicon carbide are well-known.

Figure 1C:
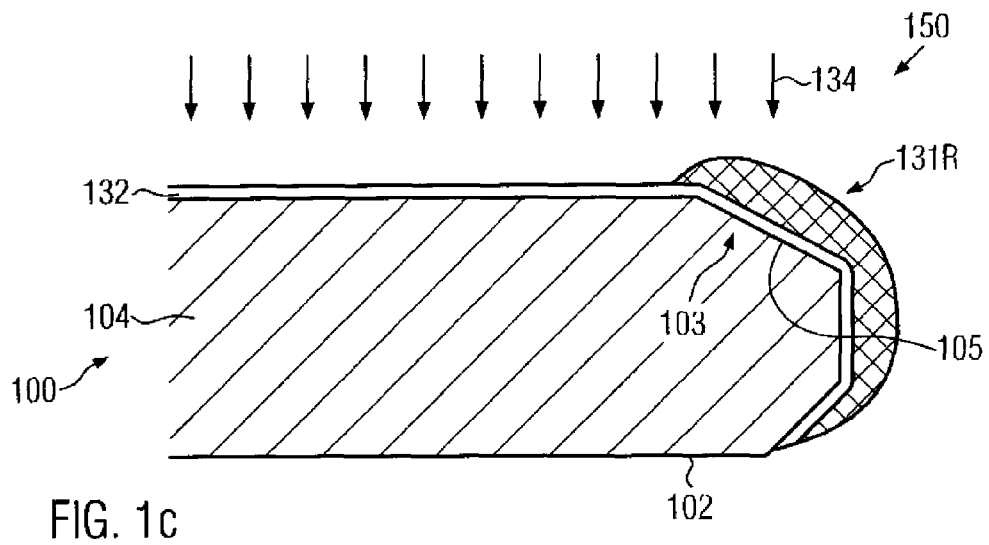

FIG. 1c schematically shows the semiconductor device 150 after the completion of the above-described etch process 133. Hence, a residue 131R of the dielectric layer 131 may be formed within a portion of the edge region 103 and in particular above the bevel 105. It should be appreciated that the dimensions of the residue 131R may depend on the excess thickness of the increased portion 131A (FIG. 1b) as well as on process parameters of the etch process 133. Consequently, the residue 131R may act as an etch mask in a subsequent etch process 134 for removing the etch stop layer 132 from the central region 104. The etch process 134 may be selected according to the specifics of the materials of the residue 131R and the etch stop layer 132 so as to remove the central portion of the etch stop layer while reliably maintaining at least a portion of the etch stop layer 132 above the bevel 105. For example, efficient anisotropic etch recipes for the removal of silicon carbide are well established in the art, wherein process parameters may be adjusted such that the removal of the exposed portion of the etch stop layer 132 above the central region 104 is completed prior to a significant material erosion of the layer 132 above the bevel 105. In one illustrative embodiment, the selectivity of the etch recipe with respect to the materials of the layer 132 and the residue 131R is adjusted to substantially completely remove the residue 131R and the etch stop layer 132 in the central region 104 while maintaining the bevel 105 covered. A corresponding etch selectivity may be established on the basis of test runs for estimating the etch rates of the materials of the layers 131, 132 for differently selected etch parameters. In still other embodiments, a spatially selective etch process may be performed after the etch process 134 in order to remove the residue 131R when the etch process 134 has a high selectivity with respect to the residue 131R. An appropriate etch regime for selectively removing the residue 131R by a bevel etch process will be described later on. For this purpose, substantially the same processes may be employed as may be used for removing unwanted dielectric and/or barrier and/or metal material during the formation of a metallization layer, wherein the remaining portion of the etch stop layer 132 protects the bevel 105.

Figure 1D:
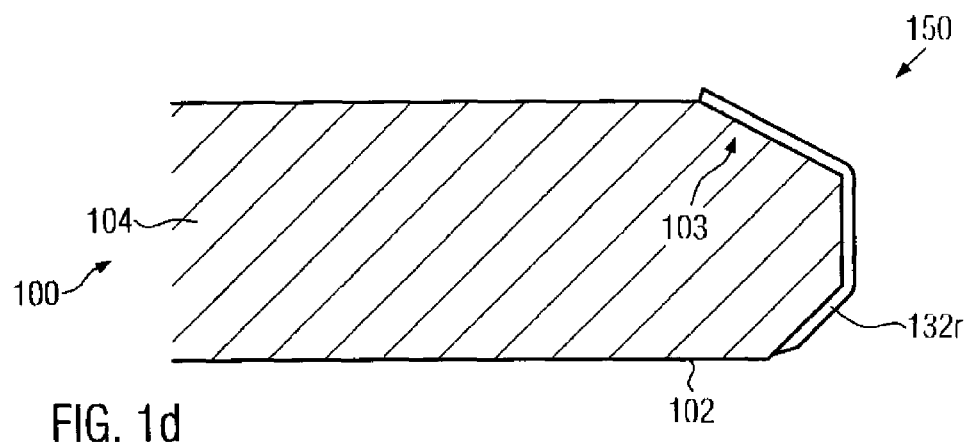

FIG. 1d schematically illustrates the device 150 after the completion of the above-described etch process 134 for removing the central portion of the etch stop layer 132 and the residue 131R. Hence, the bevel 105 of the substrate 100 is covered by a residual etch stop layer 132R, which may act as a reliable etch stop for any subsequent bevel etch processes, as will be described later on.

Figure 1E:
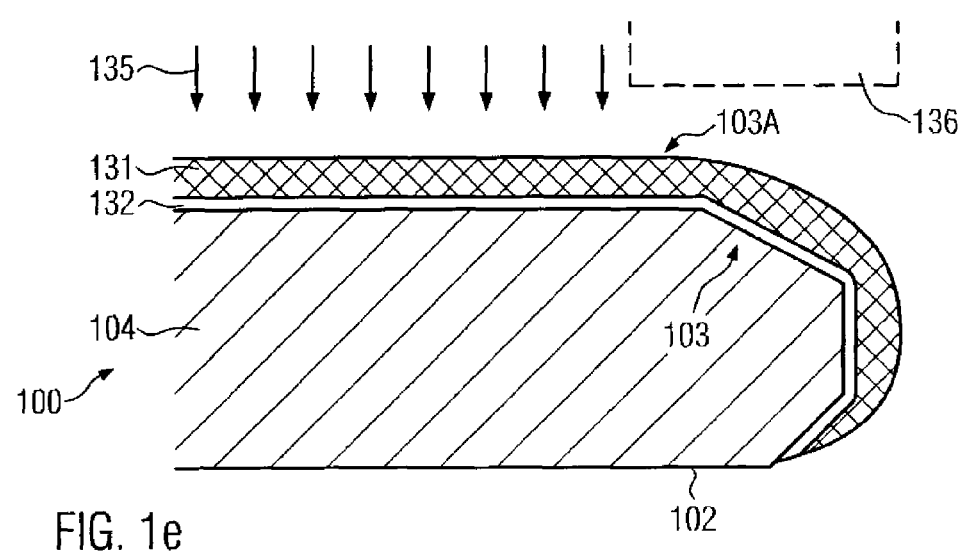

FIG. 1e schematically illustrates the device 150 in accordance with further embodiments, in which, in addition or alternatively, the mask layer 131 is treated in such a manner that its etch rate is increased in the central region 104 compared to the bevel 105. In the embodiment shown in FIG. 1e, the mask layer 131, which may or may not have an increased thickness at the bevel 105, is subjected to an ion implantation process 135 on the basis of an appropriate ion species, such as xenon and the like, so as to significantly alter the intrinsic structure of the layer 131. In one embodiment, the substantially "self-aligned" character of the implantation process 135 may alter the layer 131 in horizontal substrate portions more effectively than in tilted substrate portions, such as the bevel 105, since here the averaged thickness of the layer "seen" by the arriving ions is increased compared to the horizontal substrate portions. Consequently, the layer structure is damaged down to a reduced thickness at the bevel 105 compared to the penetration depth in the central region 104. Hence, the etch behavior of the layer 131 in the central region 104 is significantly different from that in the bevel 105. Consequently, a subsequent etch process, such as the process 133 previously described, may remove material more rapidly in the central region 104 compared to the bevel 105. Thus, the corresponding residue 131R is formed at the bevel 105, which may then act as an etch mask for patterning the etch stop layer 132. The further processing may then be continued as is described with reference to FIG. 1d.

In still another illustrative embodiment, the spatial selectivity of the ion implantation process 135 may be enhanced by providing a shadowing mask 136 that is appropriately positioned to significantly reduce the number of ions arriving at the bevel 105. Thus, a more pronounced difference in structure modification may be achieved, thereby improving the selectivity in the subsequent etch process 133. By providing the implantation mask 136, which may be accomplished by respectively positioning any appropriate material within the ion beam, the location of a transition region 103A between a highly modified layer portion and a substantially non-modified layer portion may be selected even within the edge region 103, thereby providing the potential for forming the etch stop layer 131 even on horizontal substrate areas in order to increase process margins in a subsequent spatially selective bevel etch process.

In some illustrative embodiments, when any implantation-induced damage of the substrate 100 is tolerable, the ion implantation process 135 on the basis of the mask 136 may performed so as to directly modify the structure of the etch stop layer 132 without providing the mask layer 131. In the subsequent etch process 133, the non-modified or less modified layer portion will be substantially maintained at the bevel 105.

Figure 1F:
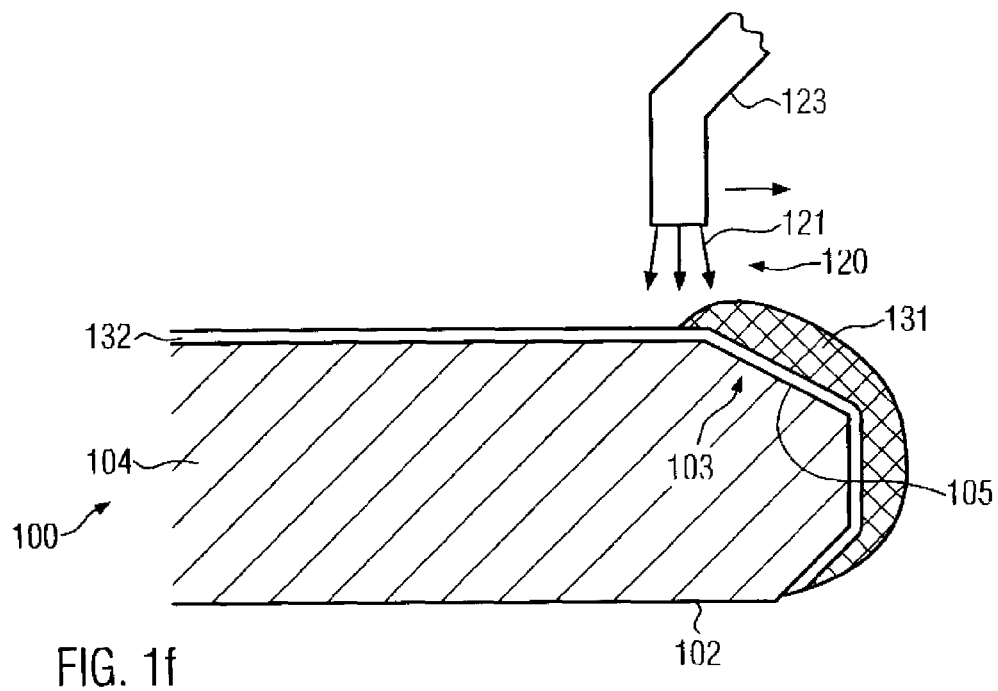

FIG. 1f schematically illustrates the device 150 according to another illustrative embodiment, in which the mask layer 131 is selectively formed at the bevel 105 by selectively supplying a viscous material, such as photoresist, polymer materials and the like, by means of an appropriate process tool, as it may also be used for the spatially selective bevel etch process. Thereafter, the etch stop layer 132 may be patterned similarly as described above. Depending on the capability of the respective process tool, the mask layer 131 may be positioned at any desired location within the edge region 104 so that the etch stop layer 132, after patterning, may also be provided on horizontal substrate portions, thereby improving process margins.

Figure 1G:
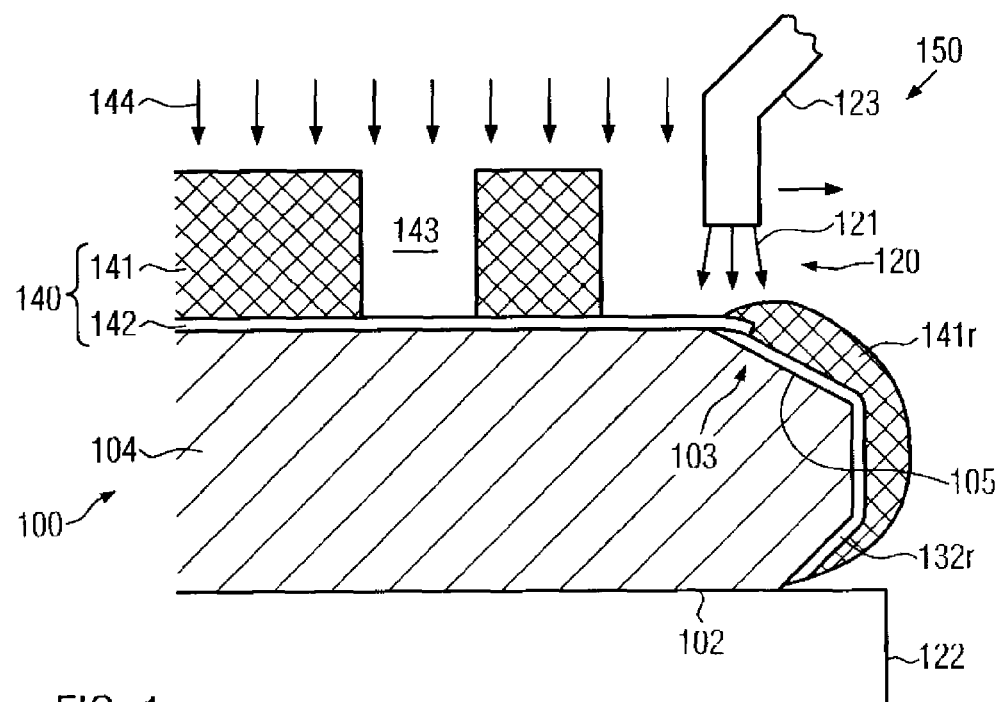

FIG. 1g schematically shows the semiconductor device 150 in a further advanced manufacturing stage, in which circuit elements, such as transistors (not shown), may have been completed, and a metallization structure is formed above the substrate 100. Hence, the device 150 may comprise a dielectric layer stack 140 comprising a second etch stop 142 and a dielectric layer 141 comprised of any suitable material that may serve as an interlayer dielectric. In some illustrative embodiments, the layer 141 comprises a low-k material. In the embodiment shown, the layer 141 may be patterned so as to have formed therein a trench and/or a via 143 for forming an interconnect structure, while, in other embodiments, the layer stack 140 may be non-structured at this stage. In this case, an increased portion may be formed, similarly as is illustrated in FIG. 1a in the context of the layer 131. In the embodiment shown, the patterning of the layer 141 by an anisotropic etch process 144 may result in a residue 141R of the previously formed increased portion, as is previously explained. Contrary to conventional techniques, however, the etch stop layer 132R is provided as a bottom layer of the stack 140, thereby enabling a reliable removal of the materials of the stack 140 at any desired time of the manufacturing process. Thus, in one embodiment, the materials of the stack 140 may be removed prior to the etch process 144 (not shown), while, in other embodiments, the removal may be performed after the patterning of the layer 141 or after the patterning of the etch stop layer 142 or even at a later stage, when a barrier material is formed on the patterned stack 140.

For this purpose, the device 150 is subjected to a spatially selective bevel etch process 120, in which an etchant 121 is applied to the bevel region 105 in a highly spatially restricted fashion so that any circuit features are substantially not affected by the etch process 120. To this end, the substrate 100 may be placed on a substrate holder 122 of an appropriate etch module (not shown) that is configured to operate on a single substrate basis and to selectively supply the etchant 121, for example by means of a nozzle 123. The nozzle 123 and the substrate holder 122 may be configured to hold and rotate the substrate 100 with an appropriate speed so as to exert a centrifugal force to the etchant 121, thereby substantially avoiding contact of the etchant 121 with material located in and above the central region 104. An appropriate etch module that enables the selective application of the etchant 121 is, for example, available from Semitool Inc under the trademark Capsule™. It should be noted, however, that the present invention is not restricted to any particular etch tool and may be practiced with any suitable etch tool that enables the highly selective application of the etchant 121. In one illustrative embodiment, the etchant 121 may be comprised of an etch chemistry exhibiting a high etch selectivity with respect to the material of the etch stop layer 132R so as to enable a highly selective removal of the residue 141R while not substantially affecting the etch stop layer 132R. Corresponding highly selective isotropic etch chemistry are well established in the art. In one illustrative embodiment, the etchant 121 may be comprised of a diluted solution of hydrofluoric acid (HF) and/or nitric acid ($HNO_3$). Hereby, the ratio of the de-ionized water, the hydrofluoric acid and/or the nitric acid may be selected in accordance with the desired etch rate, wherein a corresponding appropriate composition may be readily determined on the basis of experimental data and the like. Due to the provision of the etch stop layer 132R, there is little, if any, removal of material from the portions of the substrate 100 exposed to the etch process 120. Moreover, as previously explained, the dimensions of the residue 141R may depend on the process characteristics of the preceding processes and hence the process parameters for the etch process 120 may be selected on the basis of the preceding processes substantially without any adverse effects of the etchant 121 on the substrate 100.

The opening 143 may represent a via opening or a trench for a metallization layer that is fabricated in accordance with a so-called single damascene technique. Consequently, the further manufacturing process may be continued by depositing one or more barrier and/or adhesion layers, followed by an optional seed layer and an appropriate metallization metal, which in illustrative embodiments comprises copper or copper alloys. Due to the substantially complete removal of the dielectric layer stack in the edge region 103 including the bevel region 105, the probability of contamination and defects during the further process steps may be significantly reduced, as is also explained above.

Figure 1H:
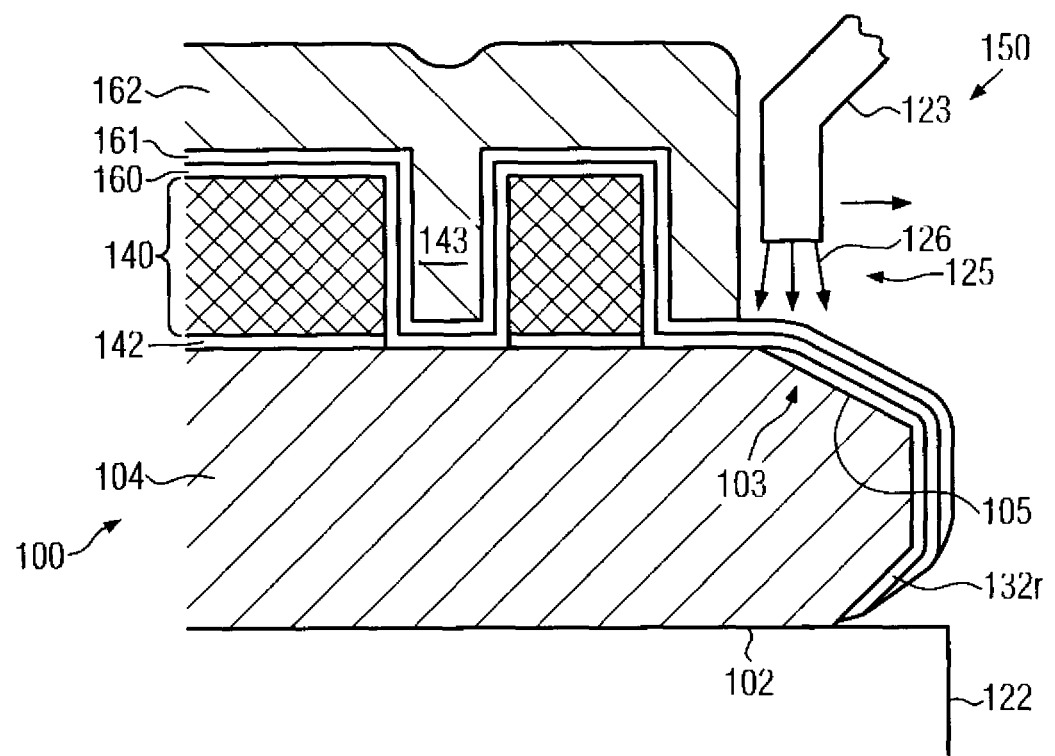

FIG. 1h schematically shows the semiconductor device 150 in a further advanced manufacturing stage that may be based on any of the above-described embodiments. The device 150 may comprise a barrier layer 160 formed on the patterned dielectric layer stack 140 and on exposed portions of the edge region 103 including the bevel 105. The barrier layer 160 may comprise any appropriate material, such as titanium, tantalum, titanium nitride, tantalum nitride and the like, which provide the required adhesion and diffusion blocking characteristics. In one illustrative embodiment, the barrier layer 160 may comprise tantalum and may, in some embodiments, include one or more sub-layers comprising, for instance, tantalum nitride to provide enhanced adhesion and copper blocking efficiency. A seed layer 161 may be formed above the barrier layer 160 and may comprise a material that enhances the deposition efficiency of a subsequent electrochemical deposition technique, such as electroplating. For example, the seed layer 161 may be comprised of copper so as to enhance the current carrying efficiency in a subsequent electroplating process. A metal layer 162, which in one illustrative embodiment comprises copper or any alloy thereof, is formed at least above the central region 104.

The device 150 as shown in FIG. 1h may be formed according to the following process flow. After the patterning of the dielectric layer stack 140, the barrier layer 160 may be formed by, for instance, sputter deposition, CVD, atomic layer deposition (ALD) and the like, wherein any appropriate cleaning processes may be performed prior to the actual deposition so as to remove any contaminants from exposed portions of contact and metal regions in the central region 104 and the edge region 103. For example, well-established process recipes for sputter depositing tantalum, tantalum nitride, titanium, titanium nitride and the like may be used to form the barrier layer 160 having the desired composition and thickness. As previously explained, many deposition techniques may not be effectively restricted to the central region 104 and hence the barrier layer 160 is usually also deposited on the edge region 103 including the bevel 105.

Thereafter, the seed layer 161 may be deposited, for instance by using well-established sputter deposition techniques, an electroless plating process and the like. Next, the metal layer 162 may be formed by an electrochemical deposition technique, such as electroplating or electroless plating, wherein, depending on the tool configuration, the deposition of the metal layer 162 may be substantially restricted to the central region 104 so that at least a portion of the edge region 103 and the bevel 105 may not receive significant amounts of the metal, such as copper or copper alloy, of the layer 162. However, tiny amounts of copper may nevertheless be deposited in the edge region 103 and the bevel 105, wherein the barrier layer 160 may prevent any unwanted copper diffusion into lower-lying device regions.

After the deposition of the metal layer 162, the device 150 may, according to one embodiment, be subjected to a further wet chemical etch process 125, during which an etchant 126 is supplied to the bevel 105 in a highly spatially restricted manner so that material in the central region 104 is not substantially affected by the etch process 125. For this purpose, substantially the same process tools may be used, as are previously described with reference to the etch process 120. Thus, any appropriate etch tool configured to process substrates on a single substrate basis and having the nozzle 123 may be used to locally selectively apply the etchant 126, substantially without affecting the central region 104. The etch process 125 may be designed to reliably remove any residues of the metal layer 162, such as copper and copper alloys, and also to remove the seed layer 161 and the barrier layer 160. For this purpose, the etchant 126 may, in one illustrative embodiment, be comprised of a diluted mixture of hydrofluoric acid (HF) and nitric acid ($HNO_3$), the ratio of which may be selected on the basis of the materials comprised in the layers 162, 161 and 160. For instance, copper and tantalum may frequently be used in highly sophisticated metallization layers. In some embodiments, the etch process 125 may comprise different etch steps, such as an etch step based on an etch recipe including a mixture of sulfuric acid and hydrogen peroxide, so as to enable an efficient removal of copper substantially without creating highly toxic nitric oxides. Thereafter, a second etch step may be performed on the basis of the above-identified chemicals, hydrofluoric acid and nitric acid, so as to efficiently remove the barrier layer 160.

Thereafter, the further processing of the device 150 may be continued by, for instance, removing any excess material of the metal layer 162 and of the seed layer 161 and the barrier layer 160, thereby creating an electrically insulated conductive via or line in the form of the metal-filled opening 143. Due to the removal of dielectric materials in the bevel 105 on the basis of the etch stop layer 132R, in the further processing of the device 150 during the removal of excess material, which may be accomplished by CMP, the probability of obtaining an increased defect rate and significant tool contamination may be reduced. Due to the removal of copper and copper alloys as well as of the seed layer 161 and barrier layer 160, especially in the critical bevel region 105, the risk of delamination during further processing of the device 150 and in particular during the further formation of subsequent metallization layers may even be further reduced while damage to the substrate 100 or any layers formed between the substrate 100 and the etch stop layer 132R may be significantly reduced. Moreover, since the substrate handling and the processing of the device 150 is less critical compared to a conventional process flow, the width D (FIG. 1a) may be reduced and may therefore only be restricted by the substrate handling requirements rather than by contamination and defect criteria. In this way, the area available for formation of circuit elements may be increased.

It should be appreciated that the present invention is not restricted to any specific metallization regime. For example, instead of the above-described single damascene strategy, a dual damascene technique may be applied. Moreover, although the reliable removal of material from the bevel on the basis of the bevel etch process including the etch stop layer 132R is highly advantageous in the context of metallization layers including a low-k material, due to the problems outlined above, the etch stop layer 132R may be formed at any desired time during the process flow and a corresponding bevel etch process for removing any unwanted material may be performed at any suitable stage. For example, when the etch stop layer 132R is formed prior to the completion of any circuit elements, a bevel etch process may even be performed during the manufacturing sequence for forming transistor elements, thereby providing the possibility to further reduce the defect rate in this manufacturing stage.

As a result, the present invention provides an enhanced technique for reducing the defect rate in particular for the formation of metallization layers, such as copper-based metallization layers comprising a low-k dielectric material deposited by CVD techniques, in which at least one additional wet etch step is performed on the basis of an etch stop layer selectively formed above the bevel so as to substantially remove the dielectric material above the bevel of the substrate in a highly spatially selective manner substantially without affecting the central region of the substrate as well as the substrate material at the bevel, thereby offering the possibility to use wet chemical recipes which exhibit a reduced selectivity to the substrate material. The etch stop layer may be efficiently formed by means of a mask layer having a different etch characteristic at the bevel compared to the central region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   selectively forming a first etch stop layer above a bevel region of a substrate, said bevel region including a bevel defined at an outer edge of said substrate, said first etch stop layer covering said bevel, said substrate having a central region adjacent to said bevel region for receiving circuit elements therein, wherein selectively forming said first etch stop layer comprises:
   depositing said first etch stop layer above said central region and said bevel region;
   depositing a mask layer above said first etch stop layer;
   selectively modifying said mask layer in said central region to increase an etch rate thereof, said mask layer providing a higher degree of protection with respect to a specified etch recipe in said bevel region compared to said central region;
   etching said mask layer using said specified etch recipe so as to expose said first etch stop layer in said central region; and
   removing said first etch stop layer from said central region;
   forming a dielectric layer stack for a metallization layer above said substrate and above said first etch stop layer; and removing a portion of at least one layer of said dielectric layer stack from said bevel region by selectively applying an etchant to said bevel region while using said first etch stop layer disposed above said bevel to reduce etch damage of said substrate at said bevel.

2. The method of claim 1, further comprising removing said mask layer after exposing said first etch stop layer in said central region.

3. The method of claim 2, wherein an exposed portion of said first etch stop layer and said mask layer are removed in a common etch process so as to maintain said first etch stop layer in said bevel region.

4. The method of claim 2, wherein said mask layer is removed after removal of said first etch stop layer from said central region.

5. The method of claim 4, wherein said mask layer is removed by selectively applying a second etchant to said bevel region.

6. The method of claim 1, further comprising forming a second etch stop layer at least in said central region prior to forming said first etch stop layer, said second etch stop layer having a reduced etch rate compared to said mask layer.

7. The method of claim 6, further comprising removing an exposed portion of said first etch stop layer on the basis of said mask layer and removing said mask layer using said second etch stop layer as an etch stop.

8. The method of claim 1, wherein a thickness of said mask layer is higher in said bevel region compared to said central region.

9. The method of claim 1, wherein selectively modifying said mask layer comprises performing an ion implantation process.

10. The method of claim 9, wherein said bevel region is shadowed during said ion implantation process.

* * * * *